United States Patent
Chen

(10) Patent No.: US 9,341,416 B2
(45) Date of Patent: May 17, 2016

(54) HEAT-DISSIPATION UNIT WITH HEAT-DISSIPATION MICROSTRUCTURE AND METHOD OF MANUFACTURING SAME

(71) Applicant: Asia Vital Components Co., Ltd., New Taipei (TW)

(72) Inventor: Ying-Tung Chen, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 155 days.

(21) Appl. No.: 14/163,648

(22) Filed: Jan. 24, 2014

(65) Prior Publication Data

US 2014/0138061 A1    May 22, 2014

Related U.S. Application Data

(62) Division of application No. 12/938,342, filed on Nov. 2, 2010, now Pat. No. 8,782,889.

(30) Foreign Application Priority Data

Dec. 18, 2009  (TW) .............................. 98143582 A

(51) Int. Cl.
*F28D 15/04* (2006.01)
*B22F 7/08* (2006.01)
(Continued)

(52) U.S. Cl.
CPC . *F28D 15/04* (2013.01); *B22F 7/08* (2013.01); *C22C 1/08* (2013.01); *C23C 26/00* (2013.01); *C23C 30/00* (2013.01); *F28D 15/046* (2013.01); *H01L 23/427* (2013.01); *F28F 2245/02* (2013.01); *H01L 2924/0002* (2013.01); *Y10T 29/49353* (2015.01); *Y10T 29/49377* (2015.01)

(58) Field of Classification Search
CPC ....... F25D 15/04; F25D 15/046; C23C 26/00; C23C 30/00; C22C 1/08; B22F 7/08; H01L 23/427; H01L 2924/0002; H01L 2924/00; Y10T 29/49353; Y10T 29/49377; Y10T 29/49982; F28F 2245/02

See application file for complete search history.

(56) References Cited

U.S. PATENT DOCUMENTS 7,124,810 B2 * 10/2006 Lee ...................... F28D 15/046
                                                      165/104.21
7,579,077 B2 *  8/2009 Dubrow ............. B01J 20/28007
                                                         424/422
(Continued)

FOREIGN PATENT DOCUMENTS

TW            1237106 B       8/2005
TW            1259894 B       8/2006
(Continued)

*Primary Examiner* — Jason L Vaughan
(74) *Attorney, Agent, or Firm* — C. G. Mersereau; Nikolai & Mersereau, P.A.

(57) ABSTRACT

A heat-dissipation unit with heat-dissipation microstructure and method of manufacturing the same is disclosed. The heat-dissipation unit with heat-dissipation microstructure includes a main body internally defining a chamber; a wick structure formed on an inner surface of the chamber; and at least a $SiO_2$ nano thin film coated on the wick structure. The $SiO_2$ nano thin film is formed of a plurality of $SiO_2$ nanograins, and is coated on the wick structure of the heat-dissipation unit through the sol-gel process. With the at least one layer of $SiO_2$ nano thin film coated on the wick structure, it is able to upgrade the heat dissipation performance of the heat-dissipation unit.

8 Claims, 14 Drawing Sheets

(51) Int. Cl.
  *C22C 1/08* (2006.01)
  *C23C 26/00* (2006.01)
  *C23C 30/00* (2006.01)
  *H01L 23/427* (2006.01)

(56) References Cited

U.S. PATENT DOCUMENTS 7,694,726 B2 * 4/2010 Chen .................. F28D 15/02
  165/104.21
7,874,347 B2 * 1/2011 Chen .................. B82Y 10/00
  165/104.21
2005/0238810 A1 * 10/2005 Scaringe .............. B82Y 30/00
  427/249.1

FOREIGN PATENT DOCUMENTS

TW  1295363 B  4/2008
TW  1343986 B  6/2011

* cited by examiner

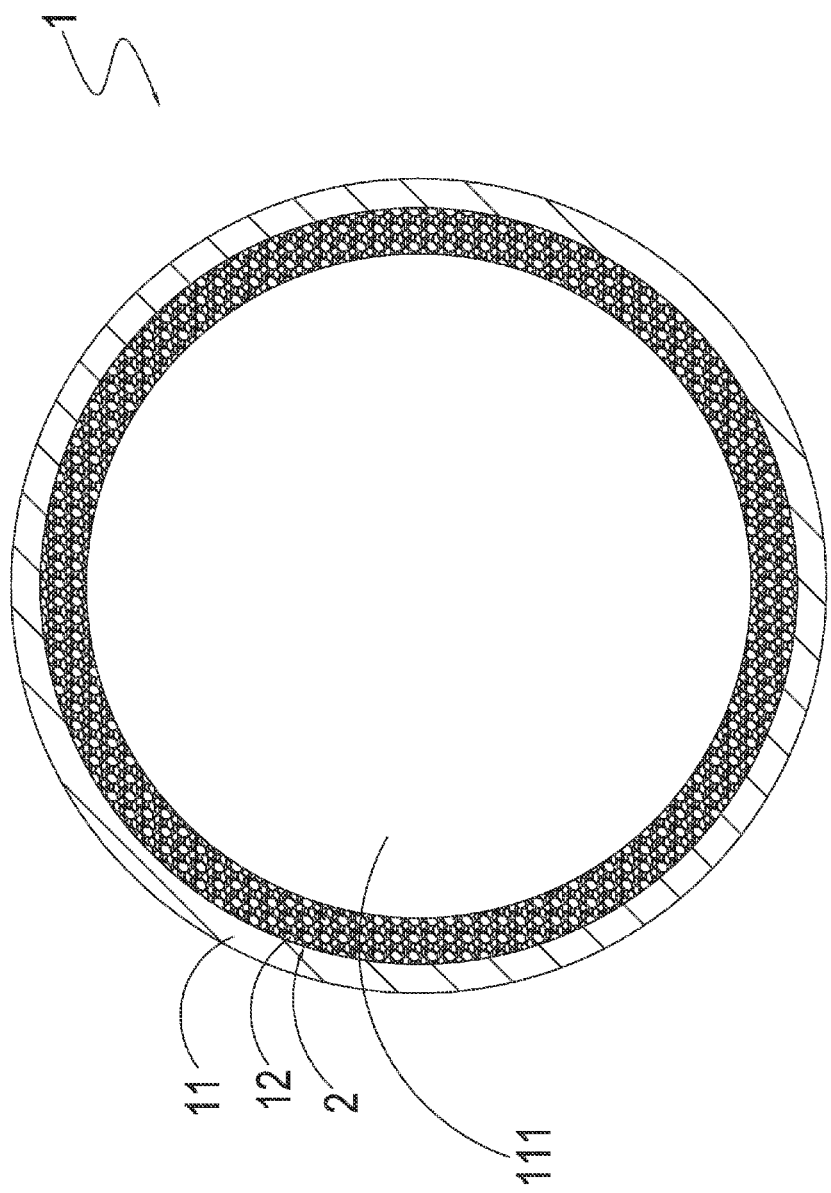

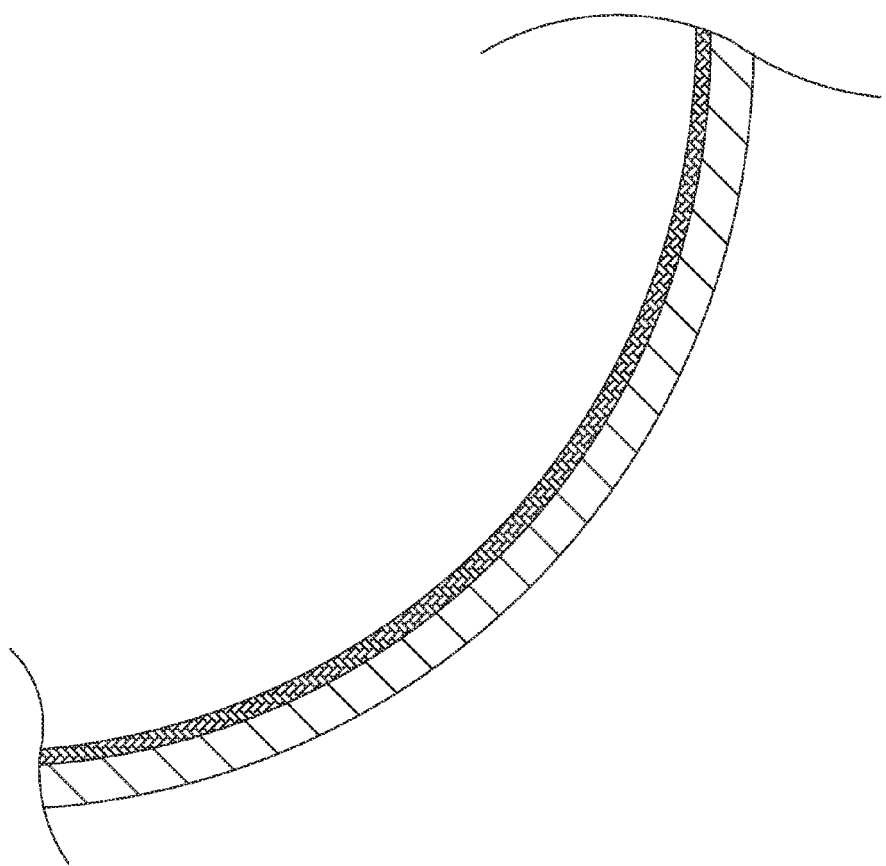

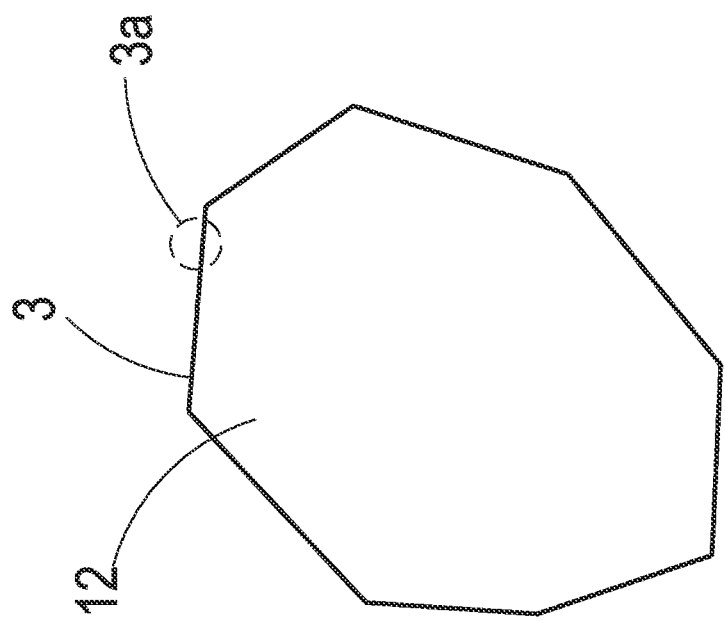

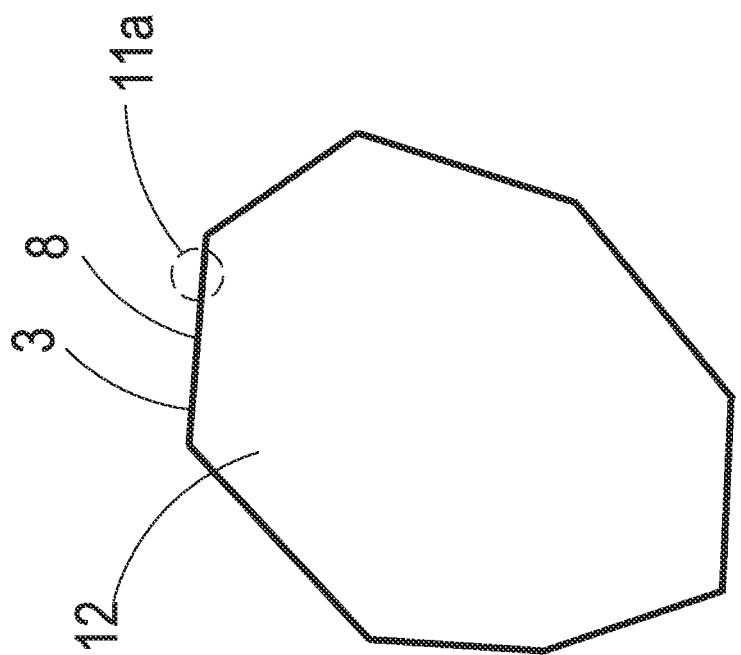

HEAT-DISSIPATION UNIT WITH HEAT-DISSIPATION MICROSTRUCTURE AND METHOD OF MANUFACTURING SAME

CROSS-REFERENCE TO RELATED APPLICATIONS

The present application is a division of U.S. patent application Ser. No. 12/938,342, filed on Nov. 2, 2010, titled Heat-Dissipation Unit with Heat-Dissipation Microstructure and Method of Manufacturing Same, listing Ying-Tung Chen, as inventor. This application claims the priority benefit of Taiwan patent application number 098143582 filed on Dec. 18, 2009.

FIELD OF THE INVENTION

The present invention relates to a heat-dissipation unit with heat-dissipation microstructure and method of manufacturing same; and more particular to a heat-dissipation microstructure being coated with a $SiO_2$ nano thin film and a method of manufacturing the same.

BACKGROUND OF THE INVENTION

While many of the currently available electronic apparatus have largely increased operational speed, the electronic elements thereof also produce a large quantity of heat. It is very important to timely remove the heat produced by the electronic elements and chips from the electronic apparatus, lest the electronic apparatus should become damaged due to overheating caused by accumulated heat therein.

To properly remove the produced heat, heat sinks or various kinds of thermal modules and cooling fans can be provided on the electronic elements and the chips, so as to cool the electronic elements and chips and to dissipate heat therefrom. Among others, heat pipe is the currently most effective and popular means for heat transfer. A heat pipe can be made of a copper material or an aluminum material to have an internal chamber. A wick structure is formed on an inner surface of the chamber, and a working fluid is provided in the chamber. After the chamber is vacuumed, an open end of the heat pipe is sealed to thereby give the heat pipe a vacuumed and completely closed chamber. The heat pipe can be configured in different shapes, but is most frequently configured as a tube or a flat hollow plate. The wick structure in the heat pipe has significant influence on the heat transfer ability of the heat pipe, particularly for the flat heat pipe, which is also referred to as a vapor chamber. An ideal wick structure must be able to provide strong capillary force while having a small flow resistance. However, these two requirements are opposed to each other in terms of structure. To solve this conflicting condition, the only way is to perform surface modification in order to change the characteristics of the surface of the material. Generally, the surface modification is aimed to change the wick structure for the latter to have wettability and accordingly increased capillary force. One of the most effective methods to modify the material surface for the same to have wettability is to produce a nano-sized microstructure. The nano-sized microstructure can be produced in different processes, including etching process and chemical vapor deposition (CVD) process. In the etching process, a chemical solution is used to corrode the material surface and thereby form a recessed microstructure thereon. However, the etching process has the disadvantages of not easy to control the etching rate and tending to cause environmental pollution. On the other hand, the CVD process can deposit a nano-sized structure on the material surface but not in the micro pores in the wick structure, and therefore fails to achieve the purpose of surface modification.

Taiwan Invention Patent Number I292028 discloses a heat pipe and a method manufacturing the same. The heat pipe includes a hollow tubular enclosure having two sealed ends, a wick structure formed on an inner wall surface of the hollow tubular enclosure and having a hydrophilic coating formed thereon; and a working fluid filling the wick structure and being sealed in the tubular enclosure. The hydrophilic coating can be formed of a material selected from the group consisting of nano-$TiO_2$, nano-ZnO, nano-$Al_2O_3$, and any combination thereof, and has a thickness ranged between 10 nm and 200 nm, preferably ranged between 20 nm and 50 nm.

According to Taiwan Invention Patent Number I292028, the tubular enclosure is formed on an outer wall surface with a thermally conductive coating, which can be formed of a material selected from the group consisting of carbon nano-tube, nano-copper, nano-aluminum, and copper-aluminum alloy nano thin film; and has a thickness ranged between 10 nm and 500 nm, preferably ranged between 20 nm and 200 nm.

The wick structure includes carbon nano capsules and carbon fibers, and has a thickness ranged between 0.1 mm and 0.5 mm, and preferably ranged between 0.2 mm and 0.3 mm.

And, the method of manufacturing the heat pipe includes the steps of providing a hollow tubular enclosure; forming a wick structure on an inner wall surface of the hollow tubular enclosure; forming a hydrophilic coating on a surface of the wick structure; and vacuum-sealing an adequate quantity of working fluid in the hollow tubular enclosure.

The inner and outer wall surfaces of the hollow tubular enclosure are subjected to a laser texturing process in advance.

The hydrophilic coating is formed through chemical vapor deposition (CVD), plasma enhanced CVD, sputtering deposition, or co-sputtering deposition.

The above-mentioned prior art heat pipe manufacturing method requires equipment and instruments that are highly expensive to inevitably increase the manufacturing cost of the heat pipe, and therefore has the following disadvantages: (1) it can only form deposition on the surface of a workpiece; (2) it is not suitable for mass-production; (3) it requires high manufacturing cost; and (4) it is implemented using expensive equipment.

SUMMARY OF THE INVENTION

A primary object of the present invention is to provide a method of manufacturing a heat-dissipation unit with heat-dissipation microstructure, so as to increase the heat transfer efficiency of the heat-dissipation unit.

Another object of the present invention is to provide a heat-dissipation unit with heat-dissipation microstructure.

To achieve the above and other objects, the heat-dissipation unit with heat-dissipation microstructure includes a main body internally defining a chamber, a wick structure formed on an inner surface of the chamber; and at least a $SiO_2$ nano thin film coated on a surface of the wick structure. The $SiO_2$ nano thin film is formed of a plurality of $SiO_2$ nanograins; and the heat-dissipation unit can be any one of a vapor chamber, a heat pipe, and a loop heat pipe. The wick structure is formed of a material selected from the group consisting of copper, aluminum, nickel, and stainless steel. The $SiO_2$ nanograins forming the $SiO_2$ nano thin film have a grain size ranged between 1 nm and 100 nm.

To achieve the above and other objects, the method of manufacturing heat-dissipation unit with heat-dissipation microstructure includes the steps of providing a heat-dissipation unit internally defining a chamber; forming a wick structure on an inner surface of the chamber of the heat-dissipation unit; coating at least an oxide nano thin film on a surface of the wick structure; drying and annealing the whole heat-dissipation unit; sintering the wick structure having the oxide nano thin film coated thereon, so that the oxide nano thin film is stably attached to the surface of the wick structure; vacuuming the chamber of the heat-dissipation unit; injecting a working fluid into the chamber; and sealing an open end of the heat-dissipation unit.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1 is a cross-sectional view of a heat dissipation unit with heat-dissipation microstructure according to a first embodiment of the present invention;

FIG. 1b is a fragmentary cross-sectional view of a heat dissipation unit with heat-dissipation microstructure according to a third embodiment of the present invention;

FIG. 3 is a schematic sectional view of a metal grain for forming a wick structure according to an embodiment of the present invention, and an oxide nano thin film coated thereon;

FIG. 11 is another schematic sectional view of the metal grain for forming the wick structure according to another embodiment of the present invention, and two oxide nano thin films coated thereon.

DETAILED DESCRIPTION OF THE PREFERRED EMBODIMENTS

Figure 1A:
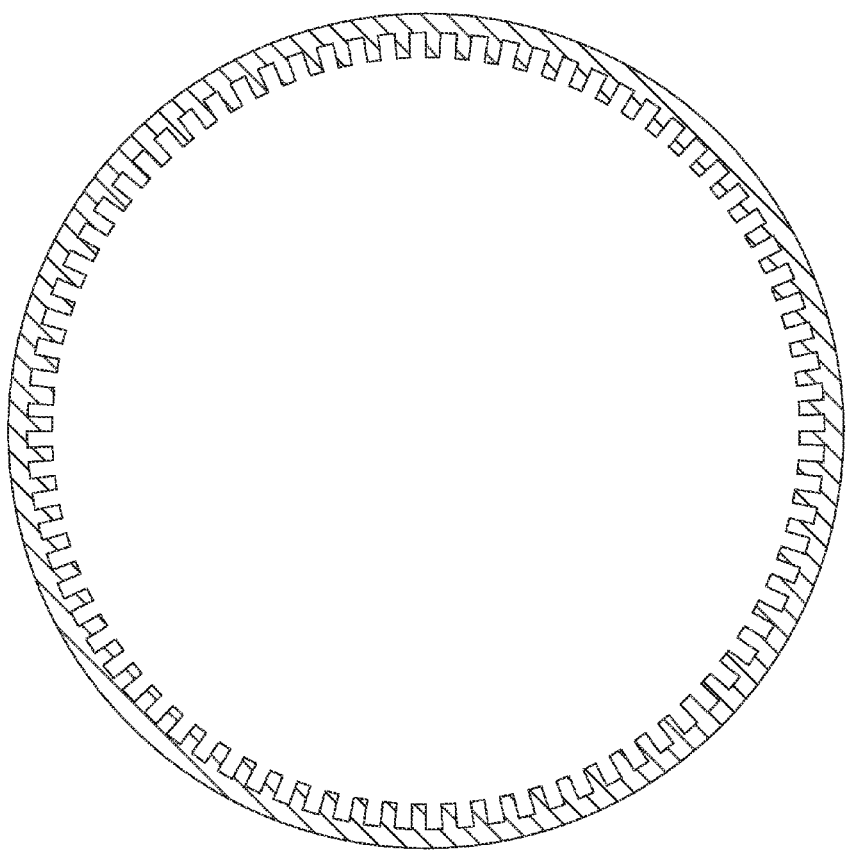
FIG. 1a is a cross-sectional view of a heat dissipation unit with heat-dissipation microstructure according to a second embodiment of the present invention.

The present invention will now be described with some preferred embodiments thereof and with reference to the accompanying drawings. For the purpose of easy to understand, elements that are the same in the preferred embodiments are denoted by the same reference numerals.

Please refer to FIGS. 1, 1a, 1b, 2, 3, 3a, 11, and 11a. A heat-dissipation unit 1 according to the present invention includes a main body 11 internally defining a chamber 111, a wick structure 2 provided on an inner surface of the chamber 111, and at least a $SiO_2$ nano thin film 3 coated on a surface of the wick structure 2. The $SiO_2$ nano thin film 3 is formed of a plurality of $SiO_2$ nanograins 31.

The wick structure 2 can be a grooved wick structure as shown in FIG. 1a, a mesh wick structure as shown in FIG. 1b, a copper-powder sintered porous wick structure as shown FIG. 1, or a composite wick structure including any combination of the grooved, mesh, and copper-powder sintered porous wick structures (not shown).

The following explanation of the illustrated embodiment of the present invention is based on the sintered copper porous wick structure as shown in FIG. 1. More specifically, the wick structure 2 is formed by sintering a plurality of metal grains 12. The metal grains 12 are selected from the group consisting of copper grains, aluminum grains, nickel grains, and stainless steel grains.

The $SiO_2$ nano thin film 3 coated on the surface of the wick structure 2 is formed of a plurality of $SiO_2$ nanograins 31 attached to an outer surface of the metal grains 12.

The $SiO_2$ nano thin film 3 has the characteristic of wetting metal, such that when the heat-dissipation unit 1 transfers heat, a working fluid (not shown) inside the heat-dissipation unit 1 can quickly pass through the wick structure 2 in the heat-dissipation unit 1 to flow backward.

The $SiO_2$ nanograins 31 forming the $SiO_2$ nano thin film 3 have a grain size ranged between 1 nm and 100 nm, and the $SiO_2$ nano thin film 3 has a thickness ranged between 50 nm and 500 nm. Preferably, the $SiO_2$ nanograins 31 have a grain size ranged between 10 nm and 40 nm, and the $SiO_2$ nano thin film 3 has a thickness ranged between 200 nm and 40 nm.

Figure 11A:
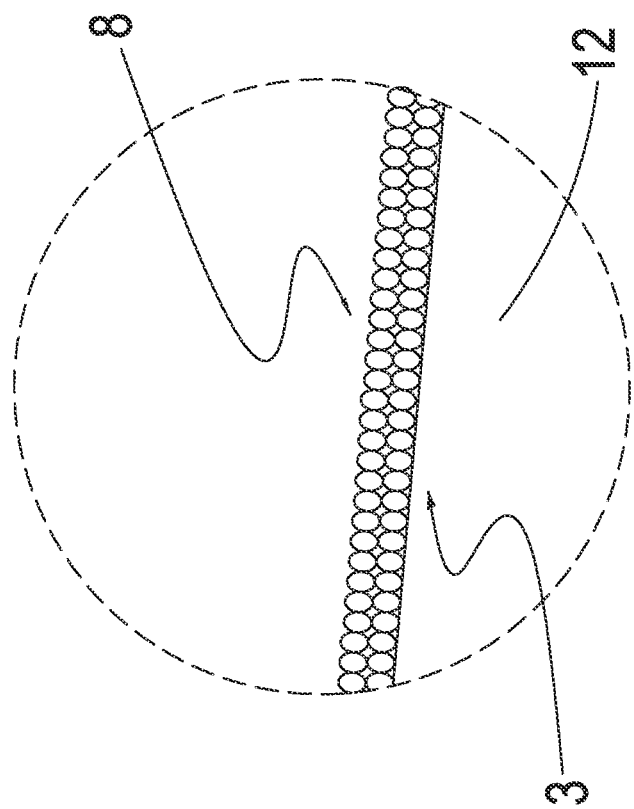
FIG. 11a is an enlarged view of the circled area 11a of FIG. 11.

Another oxide thin film 8 can be further coated over the $SiO_2$ nano thin film 3, as shown in FIGS. 11 and 11a. The oxide thin film 8 is form of a material selected from the group consisting of $TiO_2$, $Al_2O_3$, $ZrO_2$, $CaO$, $K_2O$, and $ZnO$.

Please refer to FIGS. 1, 2, and 4 to 8. As shown, in a first embodiment of a method of manufacturing heat-dissipation unit with heat-dissipation microstructure according to the present invention, the following steps are included:

Step S1: providing a heat-dissipation unit internally defining a chamber.

Figure 2:
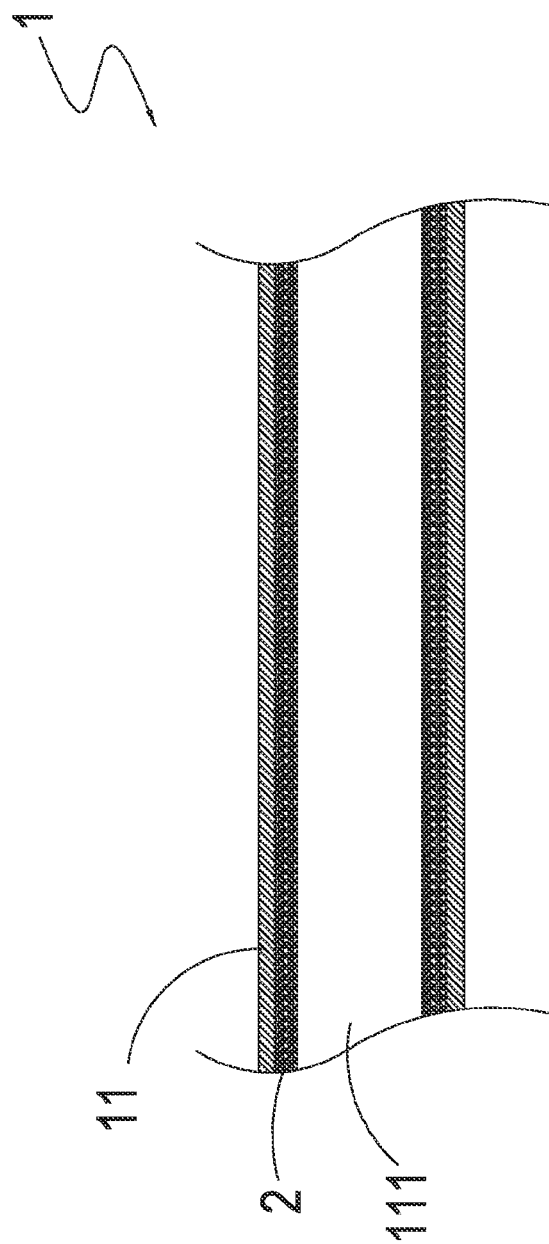
FIG. 2 is a cross-sectional view of another type of heat-dissipation unit with heat-dissipation microstructure according to the present invention.
Figure 3A:
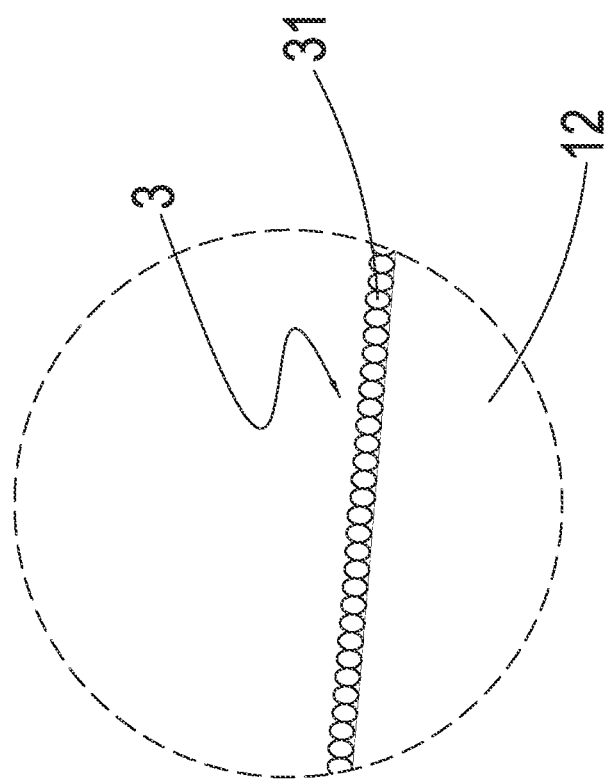
FIG. 3a is an enlarged view of the circled area 3a of FIG. 3.

In this step, a heat-dissipation unit 1 with an internal chamber 111 is prepared. The heat-dissipation unit 1 can be a heat pipe as shown in FIG. 1, or a vapor chamber as shown in FIG. 2, or a loop heat pipe (not shown).

Step S2: forming a wick structure on an inner surface of the chamber in the heat-dissipation unit.

In this step, a wick structure 2 is formed on an inner surface of the chamber 111 in the heat-dissipation unit 1. The first embodiment of the method according to the present invention is explained based on a wick structure 2 that is a porous wick structure 2 formed by sintering metal grains 12. However, it is understood the wick structure 2 can also be formed by other ways without being limited to the way of sintering metal grains. In the case of the porous wick structure 2, it can be formed by sintering metal grains 12 selected from the group consisting of copper grains, aluminum grains, nickel grains, and stainless steel grains.

And, the wick structure 2 can be a grooved wick structure as shown in FIG. 1a, a mesh wick structure as shown in FIG. 1b, a copper-powder sintered porous wick structure as shown FIG. 1, or a composite wick structure combining the copper-powder sintered porous wick structure and the mesh wick structure (not shown).

Step S3: coating at least an oxide nano thin film on a surface of the wick structure.

In this step, at least an oxide nano thin film 4 is coated on the wick structure 2 of the heat-dissipation unit 1. The oxide nano thin film 4 is formed of a material selected from the group consisting of $Al_2O_3$, $SiO_2$, $ZrO_2$, CaO, $K_2O$, $TiO_2$, and ZnO. And, the oxide nano thin film 4 can be coated on the wick structure 2 through a sol-gel process, which can be implemented in any one of the following manners: dip-coating deposition, settle-coating deposition, spin-coating deposition, spray-coating deposition, brush-coating deposition, and wet-coating deposition.

Figure 8:
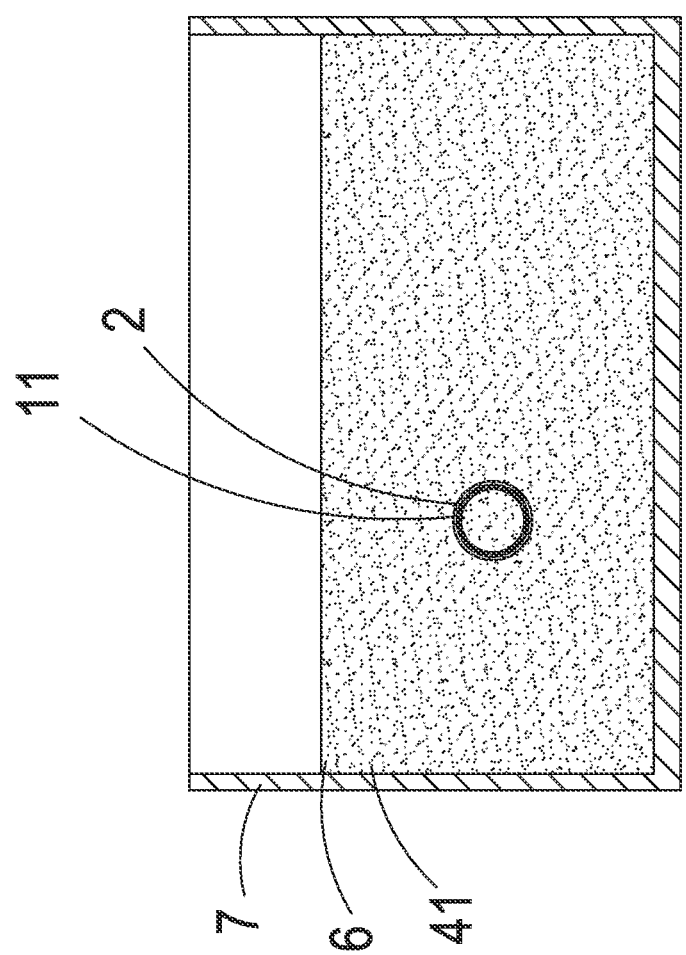
FIG. 8 is a schematic sectional view showing the forming of at least an oxide nano coating on the wick structure according to the method of the present invention.
Figure 9:
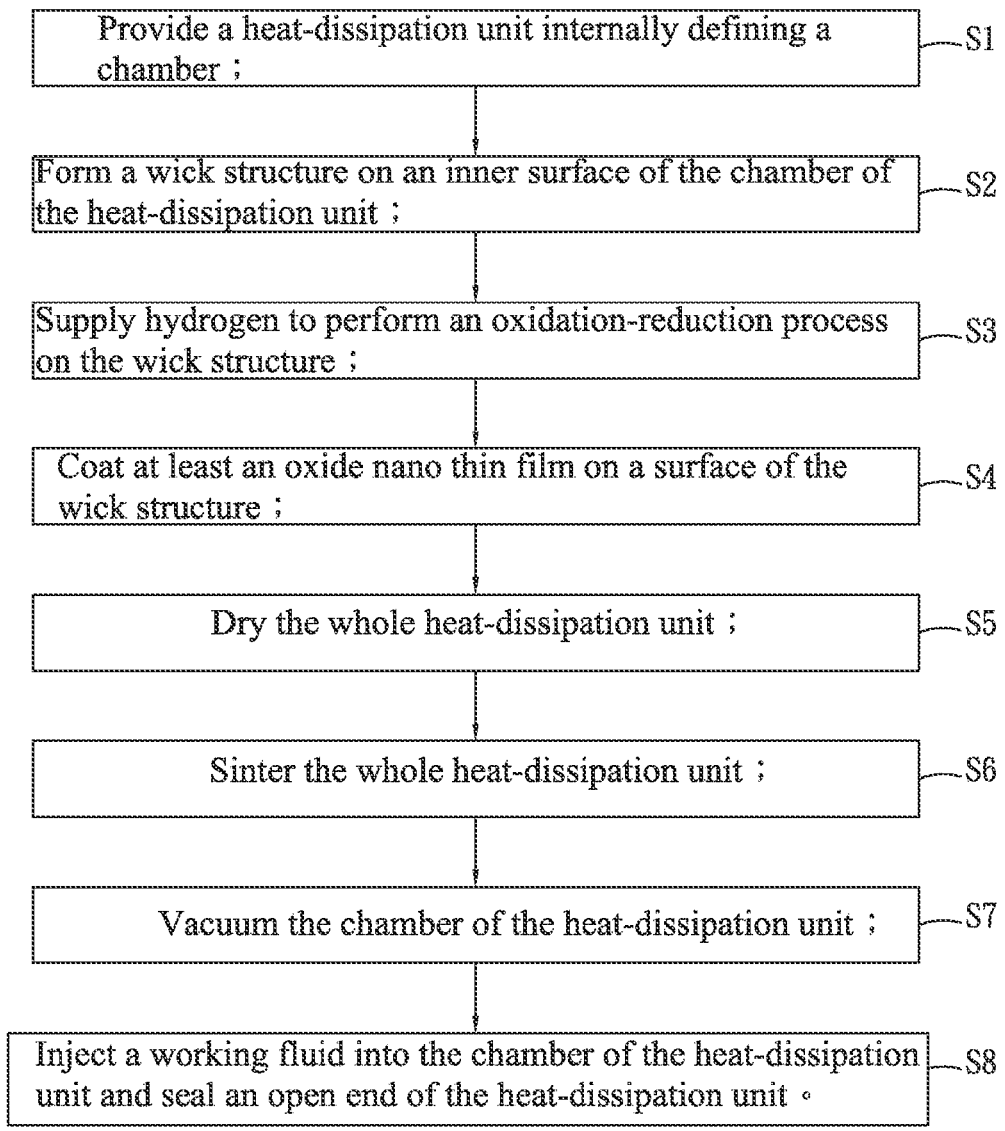
FIG. 9 is a flowchart showing the steps included in a second embodiment of the method of manufacturing heat-dissipation unit with heat-dissipation microstructure according to the present invention.
Figure 10:
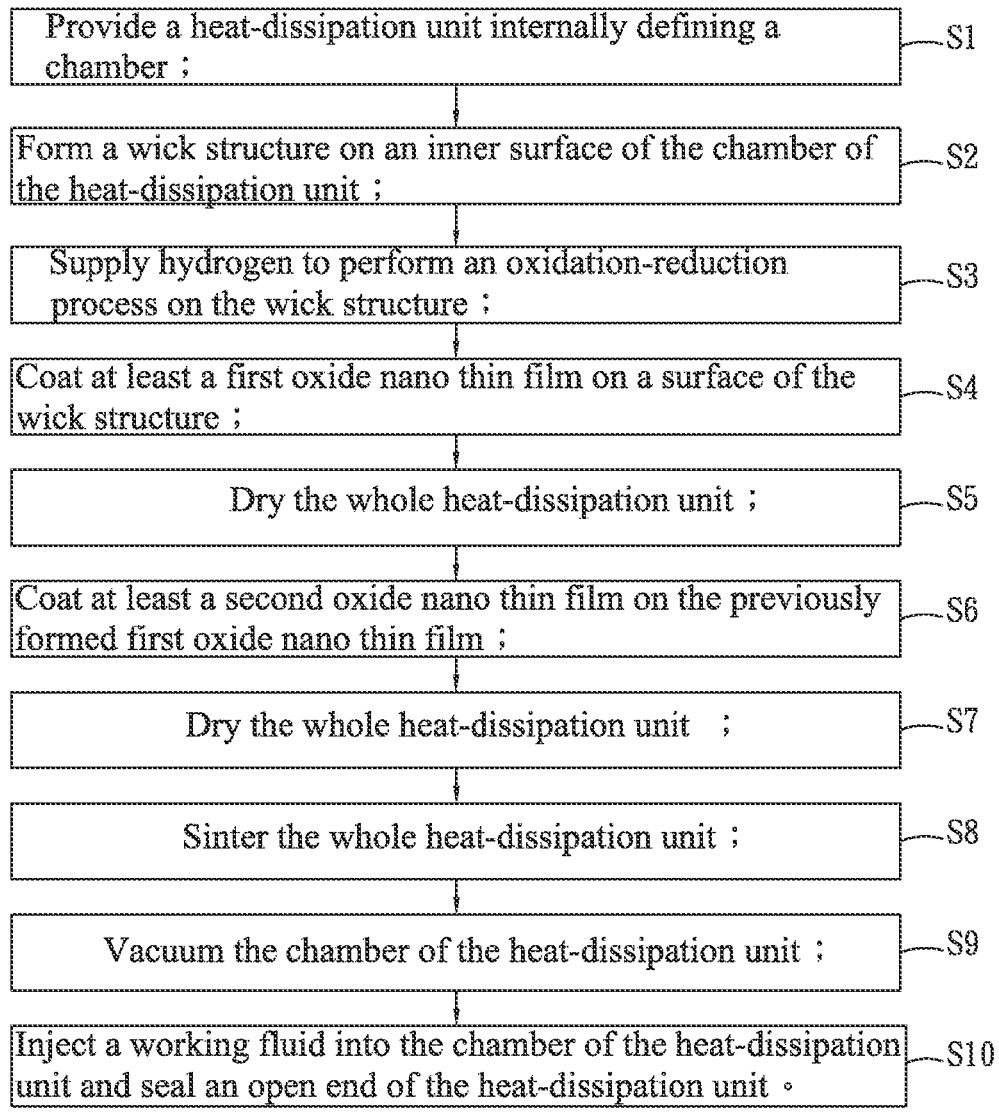
FIG. 10 is a flowchart showing the steps included in a third embodiment of the method of manufacturing heat-dissipation unit with heat-dissipation microstructure according to the present invention.

In the illustrated first embodiment of the method of the present invention, the oxide nano thin film 4 is coated through the dip-coating deposition of the sol-gel process. However, it is understood the oxide nano thin film 4 can also be coated through other deposition manners of the sol-gel process without being limited to the dip-coating deposition. As shown in FIG. 8, in the sol-gel process, grains 41 selected from the group consisting of $Al_2O_3$ grains, $SiO_2$ grains, $ZrO_2$, CaO grains, $K_2O$ grains, $TiO_2$ grains, and ZnO grains are soaked in a water solution 6, and the water solution 6 along with the grains 41 selected from any one of the above-mentioned materials are poured into a tank 7 and thoroughly mixed, so that the grains 41 are evenly dispersed in the water solution 6. Then, immerse a main body 11 of the heat-dissipation unit 1 having the wick structure 2 in the water solution 6 contained in the tank 7, and allow the heat-dissipation unit 1 to remain still in the water solution 6 in the tank 7 for a predetermined period of time. Finally, remove the heat-dissipation unit 1 from the water solution 6 or drain off the water solution 6 from the tank 7, so that the grains 41 are attached to an outer surface of the wick structure 2.

Step S4: drying the whole heat-dissipation unit.

In this step, the heat-dissipation unit 1 after completion of the deposition of the oxide nano thin film 4 thereon is subjected to a drying treatment. In the process of drying treatment, the heat-dissipation unit 1 can be placed at room temperature or in a sintering furnace (not shown). The sintering furnace can be set to a drying temperature ranged between 50° C. and 200° C. to dry the heat-dissipation unit 1 for 10 to 60 minutes. The higher the drying temperature is, the shorter the time for the drying treatment will be.

Step S5: Sintering the whole heat-dissipation unit.

In this step, for the oxide nano thin film 4 to form a uniform film and stably attach to the surface of the wick structure 2 of the heat-dissipation unit 1, the whole heat-dissipation unit 1 is subjected to a sintering process. In the sintering process, the heat-dissipation unit 1 is placed in a sintering furnace (not shown), and the sintering furnace is set to a sintering temperature ranged between 200° C. and 800° C. The sintering process continues for 5 to 60 minutes. Finally, the heat-dissipation unit 1 is removed from the sintering furnace.

Step S6: vacuuming the chamber of the heat-dissipation unit.

In this step, air in the chamber 111 of the heat-dissipation unit 1 is evacuated, so that the chamber 111 is in a vacuum state.

Step S7: injecting a working fluid into the chamber of the heat-dissipation unit and sealing an open end of the heat-dissipation unit.

In this step, a working fluid (not shown) is injected into the chamber 111 of the heat-dissipation unit 1. The working fluid can be deionized water, alcohol, or a type of coolant. Finally, an open end of the heat-dissipation unit 1 is sealed to prevent the working fluid from leaking out of the heat-dissipation unit 1.

Please refer to FIGS. 1-2, 4-6, and 8-9. As shown, in a second embodiment of the method of manufacturing heat-dissipation unit with heat-dissipation microstructure according to the present invention, the following steps are included:

Step 1: providing a heat-dissipation unit internally defining a chamber.

In this step, a heat-dissipation unit 1 with an internal chamber 111 is prepared. The heat-dissipation unit 1 can be a heat pipe as shown in FIG. 1, or a vapor chamber as shown in FIG. 2, or a loop heat pipe (not shown).

Step S2: forming a wick structure on an inner surface of the chamber in the heat-dissipation unit.

In this step, a wick structure 2 is formed on an inner surface of the chamber 111 in the heat-dissipation unit 1. The second embodiment of the method according to the present invention is explained based on a wick structure 2 that is a porous wick structure 2 formed by sintering metal grains 12. However, it is understood the wick structure 2 can also be formed by other ways without being limited to the way of sintering metal grains. In the case of the porous wick structure 2, it can be formed by sintering metal grains 12 selected from the group consisting of copper grains, aluminum grains, nickel grains, and stainless steel grains.

And, the wick structure 2 can be a grooved wick structure as shown in FIG. 1a, a mesh wick structure as shown in FIG. 1b, a copper-powder sintered porous wick structure as shown FIG. 1, or a composite wick structure including any combination of the grooved, mesh, and copper-powder sintered porous wick structures (not shown).

Step S3: supplying hydrogen for performing an oxidation-reduction process on the wick structure.

In this step, an amount of hydrogen (5% $H_2$+95% $Ar_2$) is supplied into an atmosphere furnace and the heat-dissipation unit 1 is placed in the atmosphere furnace, so that the wick structure 2 formed on the surface of the chamber 111 of the heat-dissipation unit 1 is subjected to an oxidation-reduction process at 700° C. for one hour, in order to remove oxides from the surface of the wick structure 2.

Step S4: coating at least an oxide nano thin film on the surface of the wick structure.

In this step, after completion of the oxidation-reduction process in the previous step S3, at least an oxide nano thin film 4 is coated on the wick structure 2 of the heat-dissipation unit 1. The oxide nano thin film 4 is formed of grains selected from the group consisting of $Al_2O_3$, $SiO_2$, $ZrO_2$, CaO, $K_2O$, $TiO_2$, and ZnO grains. And, the oxide nano thin film 4 can be coated on the wick structure 2 through the sol-gel process, which can be implemented in any one of the following manners: dip-coating deposition, settle-coating deposition, spin-coating deposition, spray-coating deposition, brush-coating deposition, and wet-coating deposition.

In the illustrated second embodiment of the method of the present invention, the oxide nano thin film 4 is coated through the dip-coating deposition of the sol-gel process. However, it is understood the oxide nano thin film 4 can also be coated through other deposition manners of the sol-gel process without being limited to the dip-coating deposition. As shown in FIG. 8, in the sol-gel process, grains 41 selected from the group consisting of $Al_2O_3$ grains, $SiO_2$ grains, $ZrO_2$, CaO grains, $K_2O$ grains, $TiO_2$ grains, and ZnO grains are soaked in a water solution 6, and the water solution 6 along with the grains 41 selected from any one of the above-mentioned grains are poured into a tank 7 and thoroughly mixed, so that the grains 41 are evenly dispersed in the water solution 6. Then, immerse a main body 11 of the heat-dissipation unit 1 having the wick structure 2 in the water solution 6 contained in the tank 7, and allow the heat-dissipation unit 1 to remain still in the water solution 6 in the tank 7 for a predetermined period of time. Finally, remove the heat-dissipation unit 1 from the water solution 6 or drain off the water solution 6 from the tank 7, so that the grains 41 are attached to an outer surface of the wick structure 2.

Step S5: drying the whole heat-dissipation unit.

In this step, the heat-dissipation unit 1 after completion of the deposition of the oxide nano thin film 4 thereon is subjected to a drying treatment. In the process of drying treatment, the heat-dissipation unit 1 can be placed at room temperature or in a sintering furnace (not shown). The sintering furnace can be set to a drying temperature ranged between 50° C. and 200° C. to dry the heat-dissipation unit 1 for 10 to 60 minutes. The higher the drying temperature is, the shorter the time for the drying treatment will be.

Step S6: sintering the whole heat-dissipation unit.

In this step, for the oxide nano thin film 4 to form a uniform film and stably attach to the surface of the wick structure 2 of the heat-dissipation unit 1, the whole heat-dissipation unit 1 is subjected to a sintering process. In the sintering process, the heat-dissipation unit 1 is placed in a sintering furnace (not shown), and the sintering furnace is set to a sintering temperature ranged between 200° C. and 800° C. The sintering process continues for 5 to 60 minutes. Finally, the heat-dissipation unit 1 is removed from the sintering furnace.

Step S7: vacuuming the chamber of the heat-dissipation unit.

In this step, air in the chamber 111 of the heat-dissipation unit 1 is evacuated, so that the chamber 111 is in a vacuum state.

Step S8: injecting a working fluid into the chamber of the heat-dissipation unit and sealing an open end of the heat-dissipation unit.

In this step, a working fluid (not shown) is injected into the chamber 111 of the heat-dissipation unit 1. The working fluid can be water or a type of coolant. Finally, an open end of the heat-dissipation unit 1 is sealed to prevent the working fluid from leaking out of the heat-dissipation unit 1.

Please refer to FIGS. 1-2, 4-6, 8, and 10. As shown, in a third embodiment of the method of manufacturing heat-dissipation unit with heat-dissipation microstructure according to the present invention, the following steps are included:

Step 1: providing a heat-dissipation unit internally defining a chamber.

In this step, a heat-dissipation unit 1 with an internal chamber 111 is prepared. The heat-dissipation unit 1 can be a heat pipe as shown in FIG. 1, or a vapor chamber as shown in FIG. 2, or a loop heat pipe (not shown).

Step S2: forming a wick structure on an inner surface of the chamber in the heat-dissipation unit.

In this step, a wick structure 2 is formed on an inner surface of the chamber 111 in the heat-dissipation unit 1. The third embodiment of the method according to the present invention is explained based on a wick structure 2 that is a porous wick structure 2 formed by sintering metal grains 12. However, it is understood the wick structure 2 can also be formed by other ways without being limited to the way of sintering metal grains. In the case of the porous wick structure 2, it can be formed by sintering metal grains 12 selected from the group consisting of copper grains, aluminum grains, nickel grains, and stainless steel grains.

And, the wick structure 2 can be a grooved wick structure as shown in FIG. 1a, a mesh wick structure as shown in FIG. 1b, a copper-powder sintered porous wick structure as shown FIG. 1, or a composite wick structure including any combination of the grooved, mesh, and copper-powder sintered porous wick structures (not shown).

Step S3: supplying hydrogen for performing an oxidation-reduction process on the wick structure.

In this step, an amount of hydrogen (5% $H_2$+95% $Ar_2$) is supplied into an atmosphere furnace and the heat-dissipation unit 1 is placed in the atmosphere furnace, so that the wick structure 2 on the surface of the chamber 111 of the heat-dissipation unit 1 is subjected to an oxidation-reduction process at 700° C. for one hour to remove oxides from the surface of the wick structure 2.

Step S4: coating at least a first oxide nano thin film on the surface of the wick structure.

In this step, after completion of the oxidation-reduction process in the previous step S3, at least a first oxide nano thin film 4 is coated on the wick structure 2 of the heat-dissipation unit 1. The first oxide nano thin film 4 is formed of grains selected from the group consisting of $Al_2O_3$, $SiO_2$, $ZrO_2$, CaO, $K_2O$, $TiO_2$, and ZnO grains. And, the first oxide nano thin film 4 can be coated on the wick structure 2 through the sol-gel process, which can be implemented in any one of the following manners: dip-coating deposition, settle-coating deposition, spin-coating deposition, spray-coating deposition, brush-coating deposition, and wet-coating deposition.

In the illustrated third embodiment of the method of the present invention, the first oxide nano thin film 4 is coated through the dip-coating deposition of the sol-gel process. However, it is understood the first oxide nano thin film 4 can also be coated through other deposition manners of the sol-gel process without being limited to the dip-coating deposition. As shown in FIG. 8, in the sol-gel process, grains 41 selected from the group consisting of $Al_2O_3$ grains, $SiO_2$ grains, $ZrO_2$, CaO grains, $K_2O$ grains, $TiO_2$ grains, and ZnO grains are soaked in a water solution 6. In this third embodiment, $SiO_2$ grains are selected for use. The water solution 6 and the $SiO_2$ grains are poured into a tank 7 and thoroughly mixed, so that the $SiO_2$ grains are evenly dispersed in the water solution 6. Then, immerse a main body 11 of the heat-dissipation unit 1 having the wick structure 2 in the water solution 6 contained in the tank 7, and allow the heat-dissipation unit 1 to remain still in the water solution 6 in the tank 7 for a predetermined period of time. Finally, remove the heat-dissipation unit 1 from the water solution 6 or drain off the water solution 6 from the tank 7, so that the $SiO_2$ grains are attached to an outer surface of the wick structure 2.

Step S5: drying the whole heat-dissipation unit.

In this step, the heat-dissipation unit 1 after completion of the deposition of the first oxide nano thin film 4 thereon is subjected to a drying treatment. In the process of drying treatment, the heat-dissipation unit 1 can be placed at room temperature or in a sintering furnace (not shown). The sintering furnace can be set to a drying temperature ranged between 50° C. and 200° C. to dry the heat-dissipation unit 1 for 10 to 60 minutes. The higher the drying temperature is, the shorter the time for the drying treatment will be.

Step 6: coating at least a second oxide nano thin film on the previously coated first oxide nano thin film.

In this step, at least a second oxide nano thin film 4 is further coated on the first oxide nano thin film 4 formed in the step S4. In the third embodiment, the second oxide nano thin film 4 coated on the first oxide nano thin film 4 is formed of $TiO_2$ grains. However, it is understood the second oxide nano thin film 4 can also be formed of other oxide grains without being limited to the $TiO_2$ grains. Further, the second oxide nano thin film 4 can be coated on the first oxide nano thin film 4 through the sol-gel process, and the sol-gel process can be implemented in any one of the following manners: dip-coating deposition, settle-coating deposition, spin-coating deposition, spray-coating deposition, brush-coating deposition, and wet-coating deposition.

Step 7: drying the whole heat-dissipation unit.

In this step, the heat-dissipation unit 1 after completion of the deposition of the second oxide nano thin film 4 thereon is subjected to a drying treatment. In the process of drying treatment, the heat-dissipation unit 1 can be placed at room temperature or in a sintering furnace (not shown). The sintering furnace can be set to a drying temperature ranged between 50° C. and 200° C. to dry the heat-dissipation unit 1 for 10 to 60 minutes. The higher the drying temperature is, the shorter the time for the drying treatment will be.

Step S8: Sintering the whole heat-dissipation unit.

In this step, for the second oxide nano thin film 4 to stably attach to the surface of the first oxide nano thin film 4, the whole heat-dissipation unit 1 is subjected to a sintering process. In the sintering process, the heat-dissipation unit 1 is placed in a sintering furnace (not shown), and the sintering furnace is set to a sintering temperature ranged between 200° C. and 800° C. The sintering process continues for 5 to 60 minutes. Finally, the heat-dissipation unit 1 is removed from the sintering furnace.

Step S9: vacuuming the chamber of the heat-dissipation unit.

In this step, air in the chamber 111 of the heat-dissipation unit 1 is evacuated, so that the chamber 111 is in a vacuum state.

Step S10: injecting a working fluid into the chamber of the heat-dissipation unit and sealing an open end of the heat-dissipation unit.

In this step, a working fluid (not shown) is injected into the chamber 111 of the heat-dissipation unit 1. The working fluid can be deionized water, alcohol, or a type of coolant. Finally, an open end of the heat-dissipation unit 1 is sealed to prevent the working fluid from leaking out of the heat-dissipation unit 1.

Figure 5:
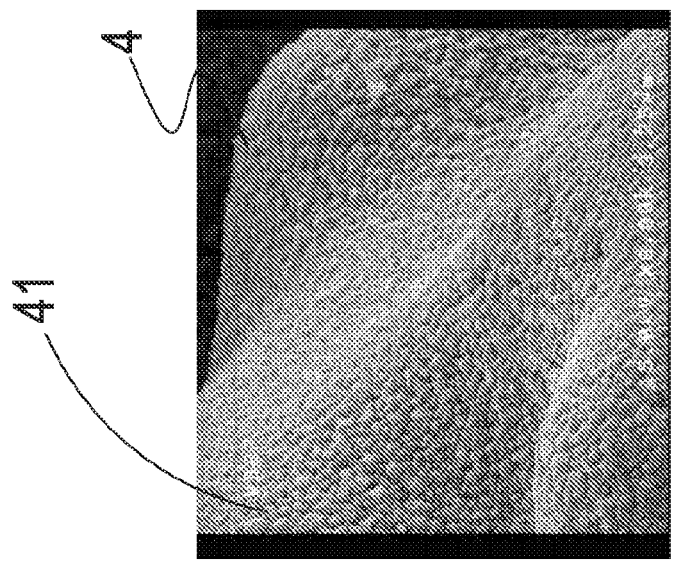
FIG. 5 is an SEM image of an oxide nano thin film coated on the wick structure according to an embodiment of the present invention.
Figure 4:
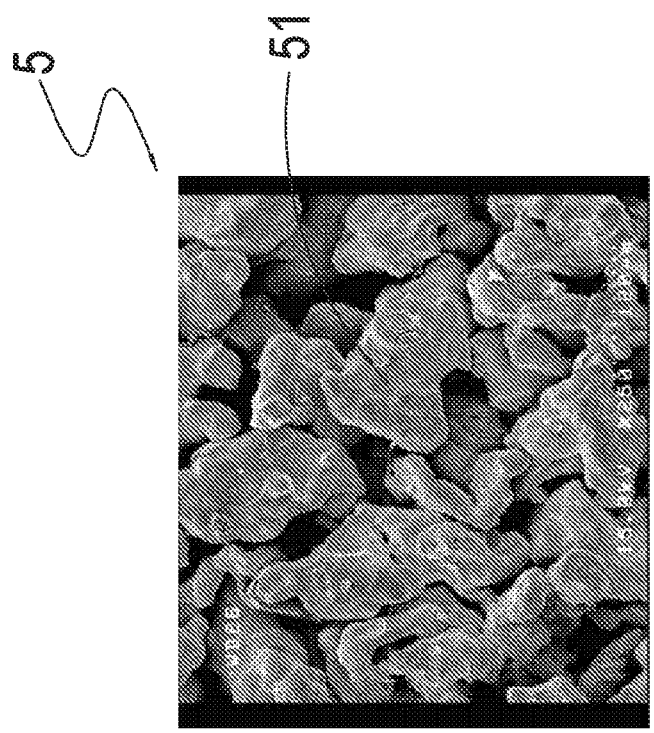
FIG. 4 is a scanning electron microscope (SEM) image of a wick structure according to an embodiment of the present invention.
Figure 6:
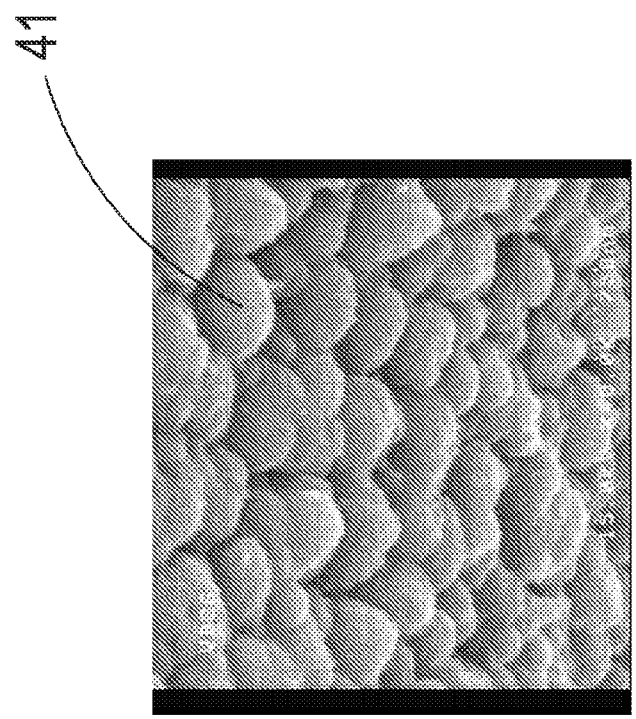
FIG. 6 is another SEM image of the oxide nano thin film coated on the wick structure according to an embodiment of the present invention.
Figure 7:
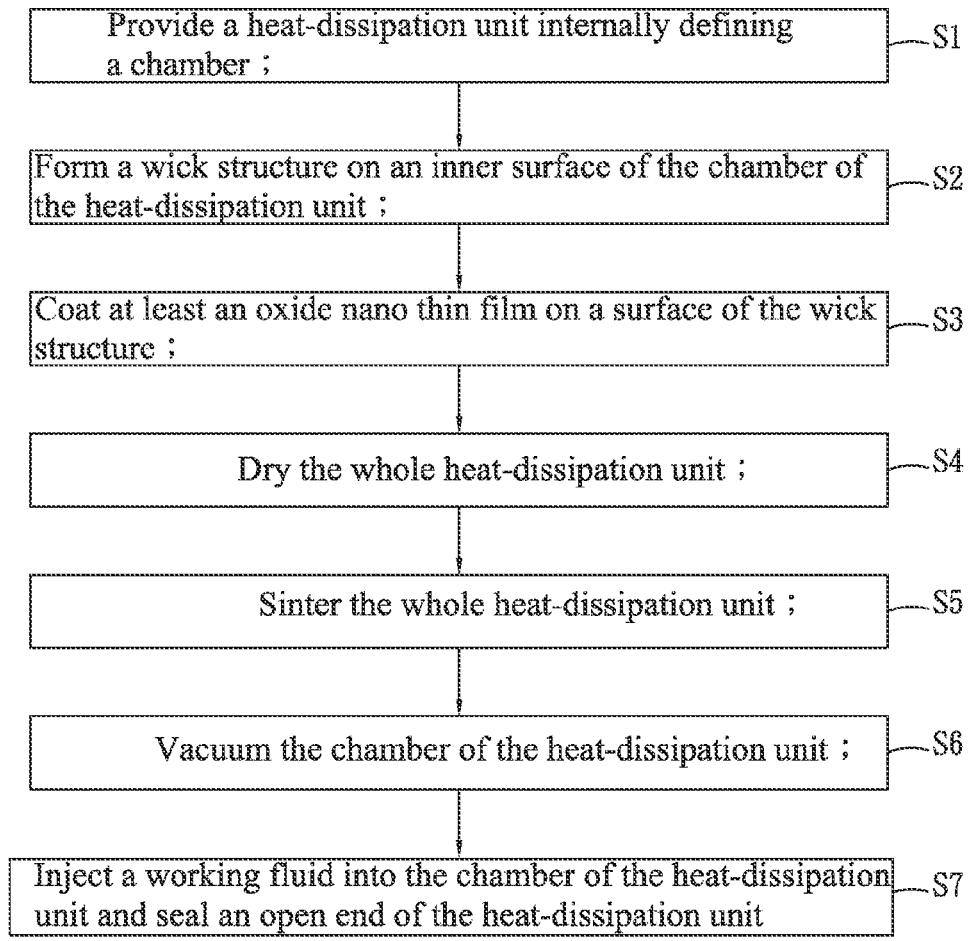
FIG. 7 is a flowchart showing the steps included in a first embodiment of a method of manufacturing heat-dissipation unit with heat-dissipation microstructure according to the present invention.

Please refer to FIGS. 4, 5 and 6, which are scanning electron microscope (SEM) images of the heat-dissipation microstructure manufactured according to the present invention. As shown in FIG. 4, the manufactured heat-dissipation microstructure is a copper wick structure 5 formed by sintering a plurality of copper grains 51, so that the copper wick structure 5 is a copper porous wick structure.

As shown in FIGS. 5 and 6, at least an oxide nano thin film 4 is uniformly coated on the surface of the copper wick structure 5 shown in FIG. 4, including pores on the copper wick structure 5.

The oxide nano thin film 4 with wettability, such as a $SiO_2$ nano thin film as shown in FIG. 5, is uniformly coated on the surface of the copper wick structure 5, and the oxide nanograins 41 forming the oxide nano thin film 4 have a relatively uniform grain size.

In the above embodiments of the present invention, the following materials are used:

1. Nano-sol surface pretreatment chemical (Product Number T-80): It is supplied by Chung-Hsin Technological Consultants, Inc. (Taiwan) and mainly contains 0.8% of $TiO_2$ nanoparticles having a particle size ≤10 nm and a type of surfactant. Its product characteristics include a specific gravity of 1.01±0.03; a flash point higher than 100° C.; in the form of a golden and transparent liquid; a pH value of 7.0±0.5; and an operating temperature of 30±5° C.
2. Nano-sol surface pretreatment chemical (Product Number LS-150): It is supplied by Chung-Hsin Technological Consultants, Inc. (Taiwan) and mainly contains 1.5% of $SiO_2$ nanoparticles having a particle size ranged between 10 nm and 40 nm. Its product characteristics include a specific gravity of 1.03±0.03; a flash point higher than 100° C.; in the form of a colorless and transparent liquid; a pH value of 7.0±0.5; and an operating temperature of 40±2° C. This material can be coated and baked (sintered) on a substrate material to form an inorganic film of $SiO_2$ on the surface of the substrate material, so that the substrate material has smooth surface, and is easily cleanable and hydrophilic.
3. Nano-sol surface pretreatment chemical (Product Number A-100): It is supplied by Chung-Hsin Technological Consultants, Inc. (Taiwan) and mainly contains 1.0% of $Al_2O_3$ nanoparticles having a particle size ≤10 nm. Its product characteristics include a specific gravity of 1.01±0.03; a flash point higher than 100° C.; having a colorless and transparent appearance; a pH value of 7.0±0.5; and an operating temperature of 10-40° C.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat-dissipation unit with heat-dissipation microstructure, comprising a main body internally defining a chamber, a wick structure formed on an inner surface of the chamber, and at least a $SiO_2$ nano thin film coated on a surface of the wick structure; wherein the $SiO_2$ nano thin film is formed of a plurality of nanograins, wherein the wick structure is formed of a material selected from the group consisting of copper, aluminum, nickel and stainless steel.

2. The heat-dissipation unit with heat-dissipation microstructure as claimed in claim 1, wherein the wick structure is selected from the group consisting of a grooved wick, a mesh wick structure, a copper-powder sintered porous wick structure, and a composite wick structure including any combination of the grooved, mesh, and copper-powder sintered porous wick structures.

3. The heat-dissipation unit with heat-dissipation microstructure as claimed in claim 1, wherein the $SiO_2$ nano thin film has a thickness ranged between 10 nm and 500 nm.

4. The heat-dissipation unit with heat-dissipation microstructure as claimed in claim 1, wherein the $SiO_2$ nano thin film is coated on a whole surface of the wick structure.

5. The heat-dissipation unit with heat-dissipation microstructure as claimed in claim 1, wherein the heat-dissipation unit is selected from the group consisting of a vapor chamber, a heat pipe, and a loop heat pipe.

6. A heat-dissipation unit with heat-dissipation microstructure, comprising a main body internally defining a chamber, a wick structure formed on an inner surface of the chamber, and at least a $SiO_2$ nano thin film coated on a surface of the wick structure; wherein the $SiO_2$ nano thin film is formed of a plurality of nanograins, wherein the nanograins forming the $SiO_2$ nano thin film have a grain size ranged between 1 nm and 100 nm.

7. A heat-dissipation unit with heat-dissipation microstructure, comprising a main body internally defining a chamber a wick structure formed on an inner surface of the chamber and at least a $SiO_2$ nano thin film coated on a surface of the wick structure; wherein the $SiO_2$ nano thin film is formed of a plurality of nanograins, wherein the $SiO_2$ nano thin film is further coated with another oxide thin film.

8. The heat-dissipation unit with heat-dissipation microstructure as claimed in claim 7, wherein the oxide thin film is formed of a material selected from the group consisting of $TiO_2$, $Al_2O_3$, ZrO2, CaO, $K_2O$, and ZnO.

* * * * *